United States Patent
Chen

(10) Patent No.: US 7,710,730 B2
(45) Date of Patent: May 4, 2010

(54) FIXING HEAT DISSIPATING UNIT AND ELECTRONIC DEVICE HAVING FIXING HEAT DISSIPATING UNIT

(75) Inventor: Liang-Wei Chen, Hsinchu (TW)

(73) Assignee: Arcadyan Technology Corporation, Hsinchu (TW)

( * ) Notice: Subject to any disclaimer, the term of this patent is extended or adjusted under 35 U.S.C. 154(b) by 0 days.

(21) Appl. No.: 12/341,282

(22) Filed: Dec. 22, 2008

(65) Prior Publication Data

US 2010/0033934 A1 Feb. 11, 2010

(30) Foreign Application Priority Data

Aug. 7, 2008 (TW) .............................. 97130159 A

(51) Int. Cl.
  *H05K 7/20* (2006.01)
  *H05K 7/02* (2006.01)
(52) U.S. Cl. .................. 361/721; 361/679.54; 361/704; 361/707; 361/719; 361/752; 361/796; 361/802; 361/807; 165/80.2; 165/185
(58) Field of Classification Search ................ 361/688, 361/690, 704, 707, 715–716, 719–721, 759, 361/796, 801–802, 804, 807–810, 752; 165/80.3, 165/185, 80.2
See application file for complete search history.

(56) References Cited

U.S. PATENT DOCUMENTS

| | | | | |
|---|---|---|---|---|
| 3,327,175 A * | 6/1967 | Binzenhofer | ................. | 361/804 |
| 5,735,407 A * | 4/1998 | Kallio | ......................... | 206/707 |
| 6,944,024 B1 * | 9/2005 | Devine, III | ................... | 361/704 |
| 7,336,494 B2 * | 2/2008 | Nishimura et al. | .......... | 361/714 |
| 7,365,990 B2 * | 4/2008 | RaghuRam | ................. | 361/720 |
| 7,502,232 B2 * | 3/2009 | Ahn | ........................... | 361/801 |
| 7,551,451 B2 * | 6/2009 | Kim et al. | .................... | 361/752 |
| 2005/0212426 A1 * | 9/2005 | Ahn | ........................... | 313/582 |
| 2006/0012963 A1 * | 1/2006 | Nishimura et al. | .......... | 361/714 |
| 2006/0245171 A1 * | 11/2006 | Kim et al. | .................... | 361/752 |
| 2007/0139897 A1 * | 6/2007 | RaghuRam | ................. | 361/720 |

* cited by examiner

*Primary Examiner*—Jayprakash N Gandhi
*Assistant Examiner*—Robert J Hoffberg
(74) *Attorney, Agent, or Firm*—Muncy, Geissler, Olds & Lowe, PLLC

(57) ABSTRACT

A fixing heat dissipating unit that is disposed in an electronic device is connected to a substrate and a heat source. The fixing heat dissipating unit includes a fixing element and a heat conducting element. The fixing element is connected to the substrate to hold the substrate in the electronic device. The heat conducting element is respectively connected to the heat source and the fixing element. The heat source is a part of the electronic device and the fixing element is integrated with the heat conducting element as a single component. An electronic device having the fixing heat dissipating unit is also disclosed.

17 Claims, 4 Drawing Sheets

FIXING HEAT DISSIPATING UNIT AND ELECTRONIC DEVICE HAVING FIXING HEAT DISSIPATING UNIT

CROSS REFERENCE TO RELATED APPLICATIONS

This Non-provisional application claims priority under 35 U.S.C. §119(a) on Patent Application No(s). 097130159 filed in Taiwan, Republic of China on Aug. 7, 2008, the entire contents of which are hereby incorporated by reference.

BACKGROUND OF THE INVENTION

1. Field of Invention

The present invention relates to a fixing heat dissipating unit with integrated functions of holding and heat dissipating, and an electronic device having the fixing heat dissipating unit.

2. Related Art

As the electronic devices are operating, the elements inside, such as the chips, usually generate heat energy. The accumulating heat energy may, however, easily overheat the electronic device and hence lead to the malfunction of the electronic device. Thus, the electronic device usually has a heat dissipating element, such as a fan, a metal heat dissipation sheet, a ceramic heat dissipation sheet, or a heat pipe, for heat dissipation. Nevertheless, the fan or the heat pipe takes a lot of space in the electronic device; and as for the fan, the heat flow is also another factor to be considered while designing. Hence other than the material cost, the design cost will as well be increased.

Additionally, the shaking occurred while moving the electronic device may damage the elements in the electronic device. Therefore, the fixing glue or a fixing element is normally used to hold the elements for increasing the reliability of the electronic device. For the elements needed to be held, the metal fixing elements usually provide better steadiness for the elements.

The above heat dissipating element and fixing element are usually separate elements, so the design cost or the testing time cannot be effectively controlled. Thus an important subject is to provide a fixing heat dissipating unit having integral design and an electronic device having this fixing heat dissipating unit.

SUMMARY OF THE INVENTION

In view of the foregoing, the present invention is to provide a fixing heat dissipating unit, which can integrate the fixing element and the heat dissipating element, and an electronic device having such fixing heat dissipating unit.

To achieve the above, the present invention discloses a fixing heat dissipating unit, which is disposed in an electronic device. The fixing heat dissipating unit that is connected to a substrate and a heat source includes a fixing element and a heat conducting element. The fixing element is connected to the substrate to hold the substrate in the electronic device. The heat conducting element is connected to the heat source and the fixing element respectively. The heat source is a part of the electronic device, and the fixing element is integrated with the heat conducting element as a single component.

In addition, the present invention also discloses an electronic device includes a first substrate, a heat source, a second substrate, and a fixing heat dissipating unit. The heat source is disposed on a surface of the first substrate, and the second substrate is disposed adjacent to the first substrate. The fixing heat dissipating unit is connected to the second substrate and the heat source respectively. The fixing heat dissipating unit includes a fixing element and a heat conducting element. The fixing element is connected to the second substrate to hold the second substrate in the electronic device, and the heat conducting element is connected to the heat source and the fixing element respectively. The fixing element is integrated with the heat conducting element as a single component.

As described above, with the integrated functions of holding and heat dissipating, the fixing heat dissipating unit and the electronic device having the fixing heat dissipating unit according to the present invention transmit the heat energy generated by the heat source through the heat conducting element to the entire fixing heat dissipating unit so as to enhance the heat dissipating efficiency by increasing the heat dissipating area. Compared to the prior art, the fixing heat dissipating unit and the electronic device of the present invention can match the positions of different substrates to provide the functions of heat dissipating and holding. Therefore, this can lower the design cost, reduce the testing time and effectively increase the reliability of the electronic product.

BRIEF DESCRIPTION OF THE DRAWINGS

The invention will become more fully understood from the detailed description and accompanying drawings, which are given for illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1A:
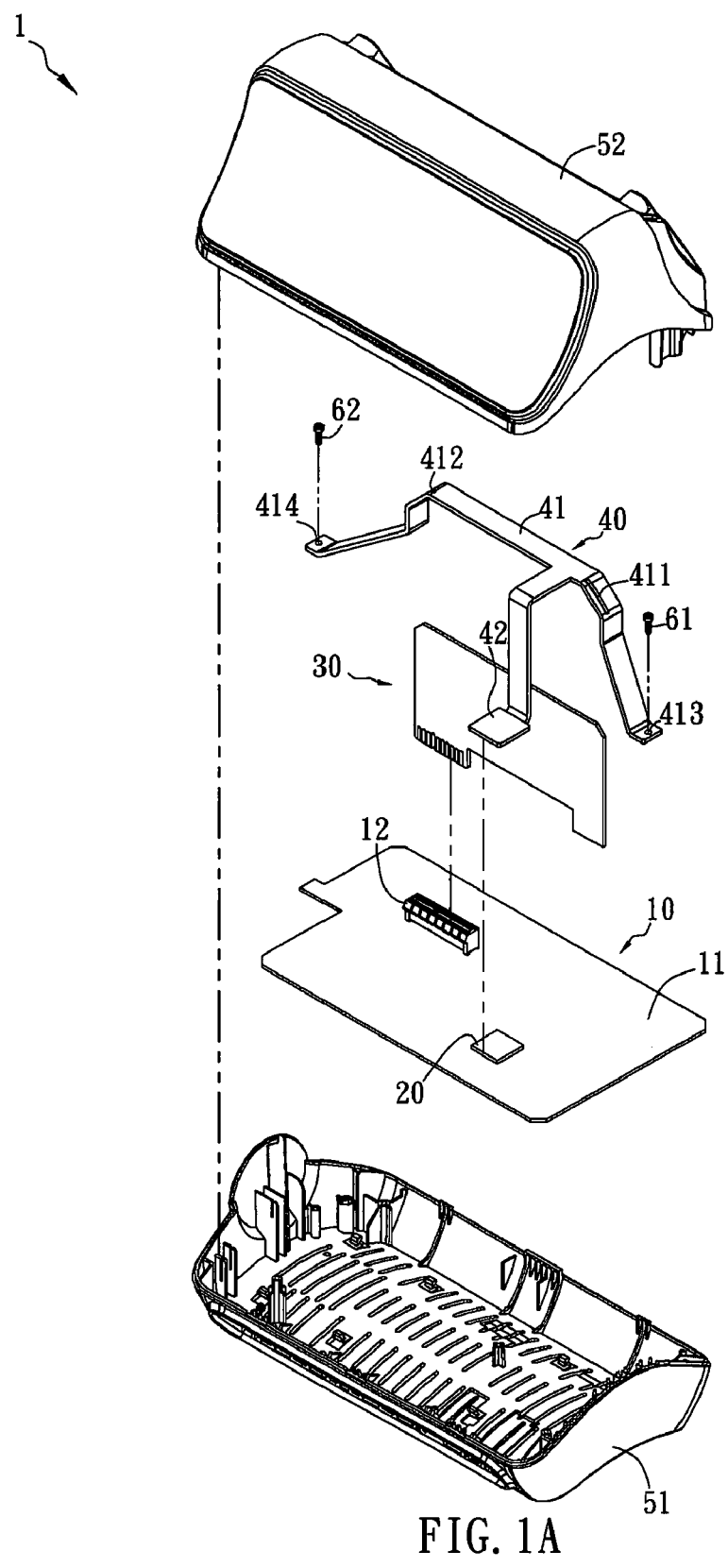
FIG. 1A is an exploded view of an electronic device according to a preferred embodiment of the present invention.
Figure 1B:
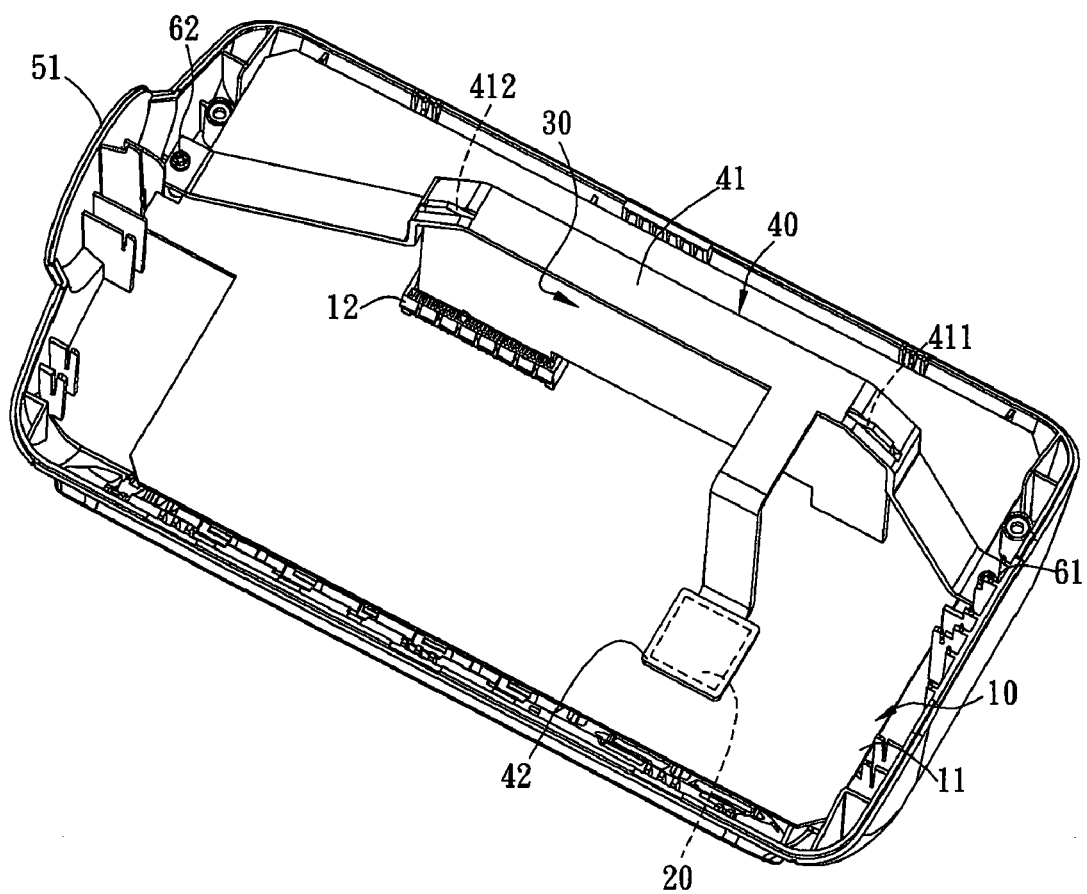
FIG. 1B is an assembled view of a part of the electronic device in FIG. 1A.

FIG. 1A is an exploded view of an electronic device according to a preferred embodiment of the present invention. FIG. 1B is an assembled view of a part of the electronic device in FIG. 1A.

Referring to FIGS. 1A and 1B, an electronic device 1 includes a first substrate 10, a heat source 20, a second substrate 30, and a fixing heat dissipating unit 40. The electronic device 1 may be a desktop, a laptop, an internet communication device, or a display device. In the embodiment, the electronic device 1 is an internet communication device applied to, for example, ADSL or VDSL.

The heat source 20 is disposed on a surface 11 of the first substrate 10. In the embodiment, the heat source 20 is, for example, a chip or an active electronic element such as a transistor, which usually produces high temperature while operating. The first substrate 10 is a printed circuit board (PCB) or a glass circuit board (GCB) for example. Additionally, a socket 12 is disposed on the surface 11 of the first substrate 10. The second substrate 30 is connected to the socket 12 and disposed adjacent to the first substrate 10. The first substrate 10 and the second substrate 30 are substantially perpendicular to each other. The second substrate 30 is electrically connected to the first substrate 10 through the socket 12 for signal transmission. In the embodiment, the second substrate 30 may be a PCB or GCB for example.

It is noted that the first substrate 10 and/or the second substrate 30 further includes one or more subsystems with an independent function, and the first substrate 10 and/or the second substrate 30 is electrically connected to the electronic device 1 to become an integrated system with an integrated function. The independent function of the subsystem may be, for example, an operating function, signal receiving/transmitting function, or control function. The integrated system is, for example, a system having the integrated function of the above independent functions of the subsystems. Furthermore, the electronic device 1 may also include more substrates (not shown) in order to have various functions.

The fixing heat dissipating unit 40 is disposed in the electronic device 1 and connects to the second substrate 30 and the heat source 20, respectively. The fixing heat dissipating unit 40 includes a fixing element 41 and a heat conducting element 42 that are connected to each other. The material of the fixing element 41 and the heat conducting element 42 may be a heat conducting material selected from at least one of a metal, an alloy, or a polymer material. The metal may be at least one of stannum (Sn), copper (Cu), and aluminum (Al).

The fixing element 41 at least includes a first opening 411 and a second opening 412, each of which is linked to at least one corner of the second substrate 30 to hold the second substrate 30 in the electronic device 1. That is, two corners of the second substrate 30 pass through the first opening 411 and the second opening 412 respectively. Moreover, the heat conducting element 42 is connected to the heat source 20 and the fixing element 41 respectively. The heat source 20 is a part of the electronic device 1, and the fixing element 41 is integrated with the heat conducting element 42 as a single component. Thus the heat conducting element 42 may contact the heat source 20 to conduct the heat energy generated by the heat source 20 to the fixing element 41, so as to dissipate the heat through the fixing heat dissipating unit 40. Additionally, a heat dissipation sheet or a heat dissipation paste (not shown) may be disposed between the heat conducting element 42 and the heat source 20 so as to enhance the heat conduction.

In the embodiment, the electronic device 1 further includes a housing having a lower housing 51 and an upper housing 52. The space formed by the housing is to contain the first substrate 10, the heat source 20, the second substrate 30, and the fixing heat dissipating unit 40. The positions and the dispositions of the first substrate 10, the second substrate 30, and the fixing heat dissipating unit 40 may be changed depending on the design of the lower housing 51 and the upper housing 52.

In the embodiment, two ends of the fixing unit 41 further have screw holes 413 and 414, respectively, for enhancing the structure of the electronic device 1. Screws 61 and 62 pass through the screw holes 413 and 414, respectively, and are screwed to the lower housing 51 so as to fix the fixing heat dissipating unit 40 to the lower housing 51. Although the fixing element 41 in the embodiment is fixed to the lower housing 51 by screwing, it can also be fixed to the lower housing 51 or the upper housing 52 by clipping or riveting according to the actual design needs. Naturally, the fixing heat dissipating unit 40 may also, for example but not limited to, be screwed on the first substrate 10, for the prime concern is the structure stability.

Moreover, the assembled appearance of the lower housing 51 and the upper housing 52 in the embodiment is a triangle-like cylinder for example. It has a certain height so that after the electronic device 1 is connected to at least one peripheral expansion module or at least one connecting line (not shown), the structure of the electronic device 1 would still have a certain level of stability. If the fixing heat dissipating unit 40 is made of a metal or alloy, a weight allocating function may be provided after disposition so as to make the electronic device 1 more steady.

Figure 2:
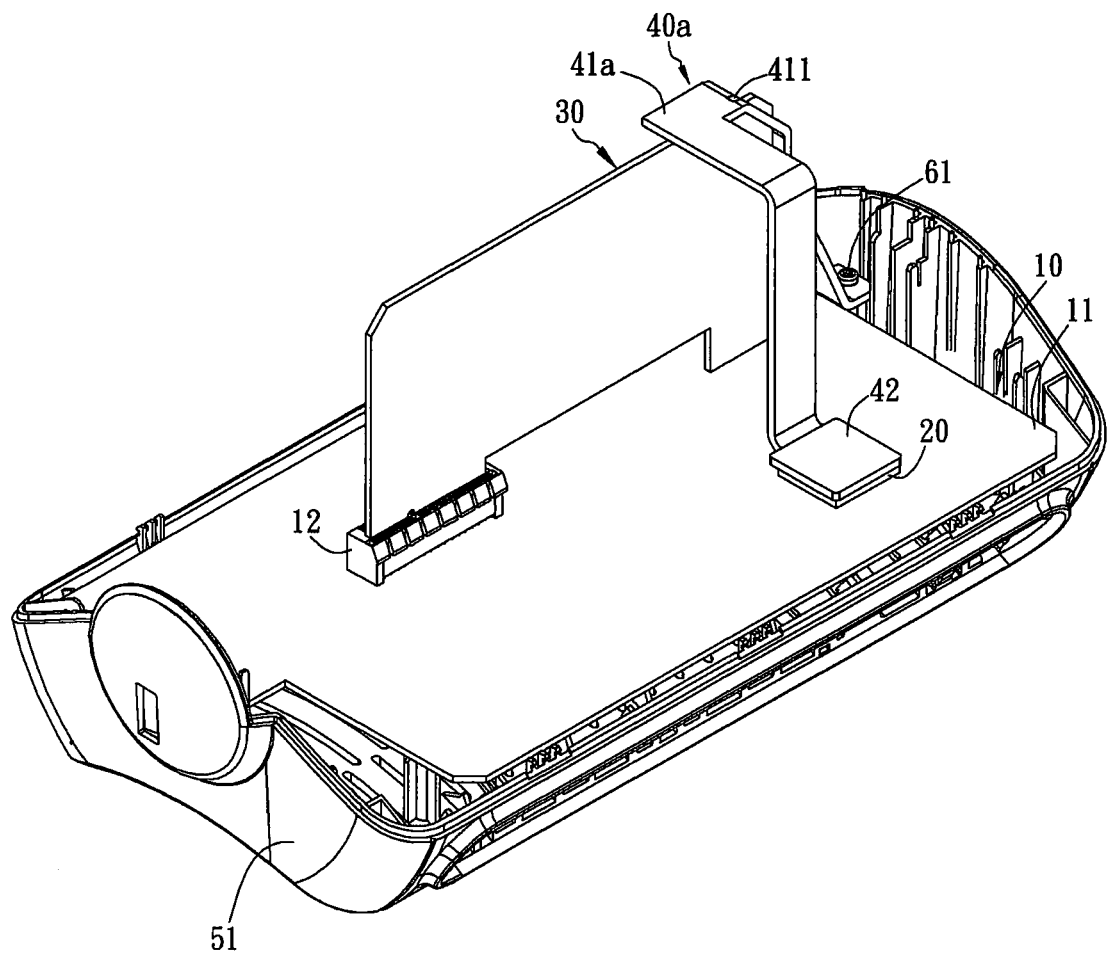
FIG. 2 is a schematic view of another aspect of the fixing heat dissipating unit according to the preferred embodiment of the present invention.

With reference to FIG. 2, it is another aspect of the fixing heat dissipating unit according to the preferred embodiment of the present invention. A fixing element 41a of a fixing heat dissipating unit 40a has only the first opening 411 for at least one corner of the second substrate 30 to pass through, hence to hold the second substrate 30 in the electronic device. One end of the fixing element 41a also includes the screw hole. The fixing heat dissipating unit 40a and the lower housing 51 are locked by the screw 61, and the heat conducting element 42 is still integrated with the fixing element 41 as a single component. Similarly, the heat conducting element 42 also contacts with the heat source 20 so as to conduct the heat energy generated by the heat source 20 to the fixing heat dissipating unit 40a for dissipating the heat. In addition, a heat dissipation sheet or a heat dissipation paste (not shown) may be disposed between the heat conducting element 42 and the heat source 20 for enhancing the heat conduction.

Figure 3:
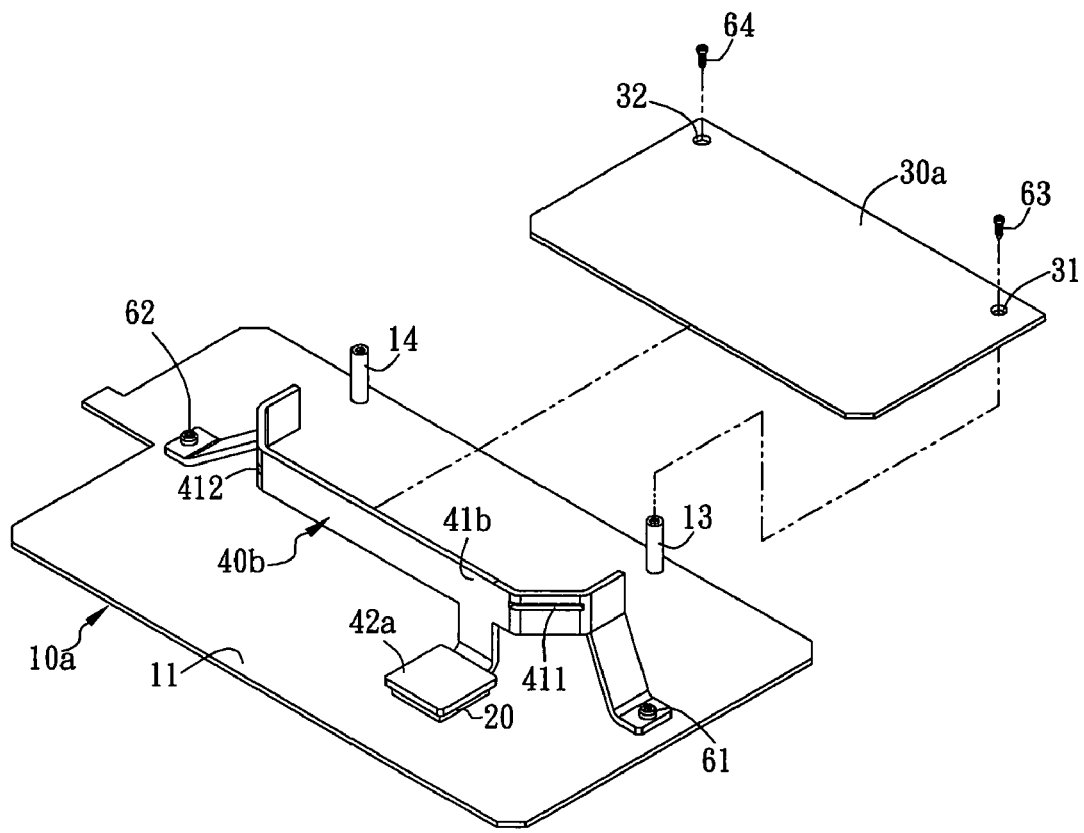
FIG. 3 is a schematic view of yet another aspect of the fixing heat dissipating unit according to the preferred embodiment of the present invention.

With reference to FIG. 3, it is yet another aspect of the fixing heat dissipating unit according to the preferred embodiment of the present invention. The difference between this aspect and the above aspect is that a second substrate 30a is disposed in parallel to a first substrate 10a, and two corners of the second substrate 30a pass through the first opening 411 and the second opening 412 of a fixing element 41b of a fixing heat dissipating unit 40b, respectively. In the embodiment, the second substrate 30a is disposed substantially in parallel to the first substrate 10a, which further includes two supporting elements 13 and 14 for supporting the second substrate 30a. The second substrate 30a includes two openings 31 and 32, and two screws 63 and 64 pass through the openings 31 and 32, respectively, for connecting with the supporting elements 13 and 14. Therefore the second substrate 30a is held on the first substrate 10a by the fixing heat dissipating unit 40b and the supporting elements 13 and 14.

In addition, the two ends of the fixing element 41b of the fixing heat dissipating unit 40b also have the screw holes respectively (not shown) in the embodiment. The difference between this aspect and the above aspect is that the screws 61 and 62 pass through the two screw holes of the fixing element 41b and then fix the fixing heat dissipating unit 40b on the first substrate 10a. However, the fixing heat dissipating unit 40b may also be fixed in the housing (not shown) according to the actual needs.

To sum up, a fixing heat dissipating unit and an electronic device having such according to the present invention integrate the fixing element and the heat dissipating element so that the heat energy generated by the heat source can be conducted to the entire fixing heat dissipating unit by contacting the heat conducting element, so as to enhance the heat dissipating efficiency by increasing the heat dissipating area. Compared to the prior art, the present invention is able to lower the design cost and reduce the testing time of the fixing element and the heat dissipating element to control the production cost. The fixing heat dissipating unit and the electronic device of the present invention can provide the functions of heat dissipating, holding, and weight allocating, thereby effectively increasing the reliability of the electronic product.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A fixing heat dissipating unit disposed in an electronic device and connected to a second substrate and a heat source, wherein the second substrate is disposed adjacent to a first substrate, and the heat source is disposed on a surface of the first substrate, the fixing heat dissipating unit comprising:
 a fixing element connected to the second substrate to hold the second substrate in the electronic device, wherein the fixing element of the fixing heat dissipating unit comprises a first opening, and a corner of the second substrate passes through the first opening; and
 a heat conducting element connected to the heat source and the fixing element respectively,
 wherein the heat source is a part of the electronic device, and the fixing element is integrated with the heat conducting element as a single component, and the second substrate is substantially perpendicular to the first substrate.

2. The fixing heat dissipating unit according to claim 1, wherein the second substrate is a printed circuit board (PCB) or a glass circuit board (GCB).

3. The fixing heat dissipating unit according to claim 1, wherein the second substrate is a subsystem having an independent function.

4. The fixing heat dissipating unit according to claim 3, wherein the second substrate is electrically connected to the electronic device to become an integrated system with an integrated function.

5. The fixing heat dissipating unit according to claim 1, further comprising:
 a heat dissipation paste or a heat dissipation sheet disposed between the heat conducting element and the heat source.

6. The fixing heat dissipating unit according to claim 1, wherein the material of the fixing element and the heat conducting element is selected from at least one of a metal, an alloy, and a polymer material.

7. The fixing heat dissipating unit according claim 6, wherein the
 material of the fixing element and the heat conducting element is selected from at least one of stannum (Sn), copper (Cu), and aluminum (Al).

8. An electronic device, comprising:
 a first substrate;
 a heat source disposed on a surface of the first substrate;
 a second substrate disposed adjacent to the first substrate; and
 a fixing heat dissipating unit connected to the second substrate and the heat source, the
 fixing heat dissipating unit comprising:
 a fixing element connected to the second substrate to hold the second substrate in the electronic device, wherein the fixing element of the fixing heat dissipating unit comprises a first opening, and a corner of the second substrate passes through the first openings and
 a heat conducting element connected to the heat source and the fixing element respectively,
 wherein the fixing element is integrated with the heat conducting element as a single component and the second substrate is substantially perpendicular to the first substrate.

9. The electronic device according to claim 8, wherein the heat source is an active electronic element.

10. The electronic device according to claim 8, wherein each of the first substrate and the second substrate is a printed circuit board (PCB) or a glass circuit board (GCB).

11. The electronic device according to claim 8, wherein the fixing
 element of the fixing heat dissipating unit further comprises a second opening linked to another corner of the second substrate.

12. The electronic device according to claim 8, wherein the material of the fixing element and the heat conducting element of the fixing heat dissipating unit is selected from at least one of a metal, an alloy, and a polymer material.

13. The electronic device according to claim 12, wherein the material of the fixing element and the heat conducting element of the fixing heat dissipating unit is selected from at least one of Sn, Cu, and Al.

14. The electronic device according to claim 8, further comprising:
 a housing containing the heat source, the first substrate, the second substrate, and the fixing heat dissipating unit.

15. The electronic device according to claim 8, wherein the fixing element and the first substrate are combined by clipping, locking, or riveting.

16. The electronic device according to claim 14, wherein the fixing element and the housing are combined by clipping or locking.

17. The electronic device according to claim 8, further comprising:
 a heat dissipation paste or a heat dissipation sheet disposed between the heat conducting element and the heat source.

* * * * *